(12) United States Patent
Jacobson et al.

(10) Patent No.: US 8,437,113 B2
(45) Date of Patent: *May 7, 2013

(54) COOLING AND SHIELDING OF A HIGH VOLTAGE CONVERTER

(75) Inventors: Björn Jacobson, Grängesberg (SE); Per-Olof Hedblad, Ludvika (SE)

(73) Assignee: ABB Technology Ltd., Zürich (CH)

( * ) Notice: Subject to any disclaimer, the term of this patent is extended or adjusted under 35 U.S.C. 154(b) by 896 days.

This patent is subject to a terminal disclaimer.

(21) Appl. No.: 12/306,022

(22) PCT Filed: Jun. 22, 2006

(86) PCT No.: PCT/SE2006/000771
§ 371 (c)(1),
(2), (4) Date: Sep. 23, 2009

(87) PCT Pub. No.: WO2007/149023
PCT Pub. Date: Dec. 27, 2007

(65) Prior Publication Data
US 2010/0014338 A1  Jan. 21, 2010

(51) Int. Cl.
*H02H 5/00* (2006.01)
(52) U.S. Cl.
USPC .......................................................... 361/103
(58) Field of Classification Search .................. 361/103
See application file for complete search history.

(56) References Cited

U.S. PATENT DOCUMENTS

| | | | |
|---|---|---|---|
| 4,010,489 A | * | 3/1977 | Bourbeau et al. ............. 257/714 |
| 4,475,152 A | | 10/1984 | Ikegame et al. |
| 4,578,745 A | | 3/1986 | Olsson |

FOREIGN PATENT DOCUMENTS

| | | |
|---|---|---|
| EP | 0142678 A2 | 5/1985 |
| GB | 2001194 A | 1/1979 |

OTHER PUBLICATIONS

International Search Report—Jan. 22, 2007.

* cited by examiner

*Primary Examiner* — Stephen W Jackson
(74) *Attorney, Agent, or Firm* — Venable LLP; Eric J. Franklin

(57) ABSTRACT

A converter for converting alternating voltage into direct voltage and vice versa in a converter station of a high voltage transmission system. A series connection of converter valves includes power semiconductor devices connected in series and arranged in superimposed layers. The valves are arranged on top of each other in a column. Coolant liquid conducting tubes are in an extension over at least one part of the circumference of the column having no connections to cooling blocks for cooling the devices made of metal. Such metal tubes are arranged in the part for over this part of the column circumference forming an electric field shielding screen. The coolant liquid conducting tubes are when extending over parts of a circumference of the column where connections are made to cooling blocks made of an electrically insulating material. An electric field shield is arranged outside the column over these parts.

23 Claims, 3 Drawing Sheets

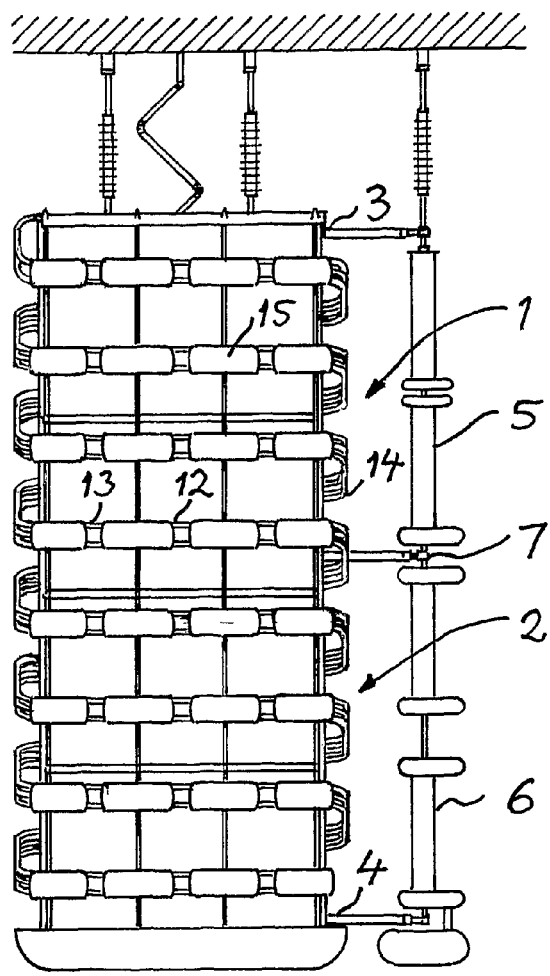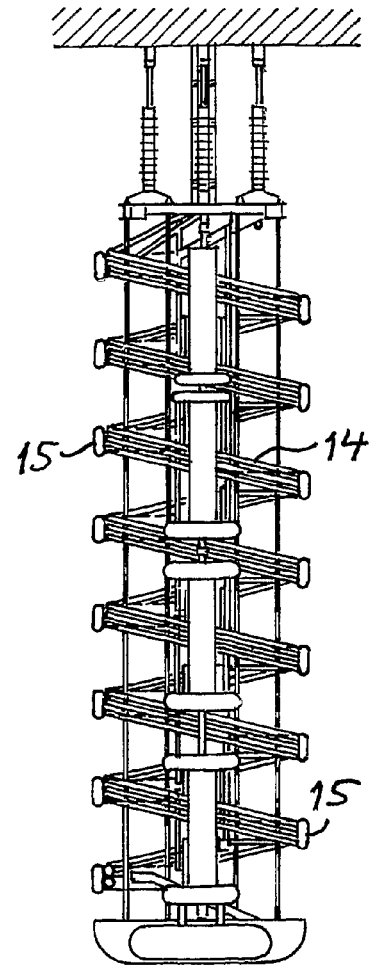
Fig 2
Fig 3

COOLING AND SHIELDING OF A HIGH VOLTAGE CONVERTER

CROSS-REFERENCE TO RELATED APPLICATIONS

This application is the national phase under 35 U.S.C. §371 of PCT/SE2006/000771 filed 22 Jun. 2006.

TECHNICAL FIELD OF THE INVENTION AND PRIOR ART

The present invention relates to a converter for converting alternating voltage into direct voltage and vice versa in a converter station of a high voltage transmission system, said converter comprising a series connection of converter valves having power semiconductor devices connected in series and arranged in superimposed layers, said valves forming at least one column of one or more converter valves, said converter also comprising means for cooling the power semiconductor devices including coolant blocks in contact with each of said devices and tubes extending around the column while conducting a coolant liquid in at least one loop through said blocks, and means for shielding the environment of said column from electric field arranged around the column outside said layers of power semiconductor devices, in which said power semiconductor devices are in each said layer arranged in at least one row with a coolant block in contact with each power semiconductor device.

Said converter may be a line-commutated CSC (Current Source Converter) converter in which the switching elements in the form of said power semiconductor devices, such as thyristors, are turned off at zero crossing of the AC current in an AC-system connected to the converter. The converter may also be a forced commutated VSC (Voltage Source Converter) converter, in which said switching elements are turn-off devices controlled according to a Pulse Width Modulation (PWM) pattern.

Each converter valve has as stated above a number of power semiconductor devices connected in series for being able to together withstand the high voltage to be withstood by such a converter valve in the blocking state thereof.

The invention is particularly, but not exclusively, directed to converters for HVDC (High Voltage Direct Current) transmission systems and the invention will therefore primarily be described for that application.

A converter of this type is normally a so-called 12-pulse bridge converter, which means that it has 12 converter valves in the form of three parallel series connections of four converter valves in each said column for connection to high potential at one end of the column and to low potential at the other. However, the invention is not restricted to such a 12-pulse configuration, but also more or fewer converter valves are conceivable, such as a 6-pulse configuration with two converter valves in each column.

In a converter of this type it is essential to have efficient said cooling means, since high powers are transmitted, and it is also essential to shield the environment of said column from electric field for protecting equipment in the surroundings of said converter column, since high voltages, well in the order of 400 kV or even 800 kV may prevail across the column. These requirements are in known converters of this type fulfilled by conducing a coolant liquid in ascending tubes along the corners of the column and then in loops connecting to these ascending tubes extending around each layer of power semiconductor devices and back to descendant tubes. Plastic tubes have been used for this sake. The shielding of the environment has been accomplished by arranging metallic screens outside the layers of power semiconductor devices, for instance by arranging these screens outside said plastic tubes to shield the converter valves in order to eliminate the risk of partial discharges or flashovers to ground.

Converters of this type are as such complicated and costly, and there is an ongoing attempt to simplify the construction thereof for saving costs and possibly also improve the properties of such a converter.

SUMMARY OF THE INVENTION

The object of the present invention is to provide a converter of the type defined in the introduction, which has a simpler and less expensive structure than such converters already known.

This object is according to the invention obtained by providing such a converter in which said coolant liquid conducting tubes are in the extension over at least one part of the circumference of said column having no connections to said coolant blocks made of metal, at least one such metal tube is arranged in said part for over this part of the column circumference also forming an electric field shielding screen, said coolant liquid conducting tubes are when extending over parts of said circumference of the column where connections are made to the coolant blocks made of an electrically insulating material, and electric field shielding means are arranged outside the column over these parts.

By combining the function of conducting coolant liquid and electric field shielding by making said tubes of metal where it is possible, the number of electric field shielding screens will be remarkably reduced with respect to known such converters resuiting in both a simpler and less expensive structure.

According to an embodiment of the invention said electric field shielding means comprises electric field shielding screens.

According to another embodiment of the invention said electric field shielding means is at least partially formed by having water flowing in said tubes of an electrically insulating material, so that it may be utilised that the water flowing in the tubes are slightly conducting and may function as an electric field shielding screen.

According to another embodiment of the invention said electric field shielding means comprises said tubes of an electrically insulating material being provided with dopants for making it somewhat semiconducting.

According to a still further embodiment of the invention said electric field shielding means comprises an arrangement of lengths of conducting material interposed between lengths of electrically insulating material in said tubes of an electrically insulating material. This and the previous embodiments of the invention may be combined for reducing the number of electric field shielding screens as much as possible and possibly remove them all also over the part of the circumference of the column having connections to said cooling blocks.

According to another embodiment of the invention a plurality of metal tubes are arranged above each other in said part of the column circumference for forming said electric field shielding screen. An electric field shielding screen may efficiently be formed by such an arrangement of a plurality of metal tubes for conducting the coolant liquid over this part of the column circumference.

According to another embodiment of the invention said column has a substantially rectangular cross-section, said power semiconductor devices are arranged in substantially horizontal rows extending along opposite sides of said column, and said coolant liquid conducting tubes are formed by one or more metal tubes in the extension over the two other sides of the column connecting said opposite sides. This results in a large reduction of the number of electric field shielding screens needed for the converter and by that great savings of material and costs.

According to another embodiment of the invention said rows extend along the long sides of the column and said metal tubes along the short sides thereof.

According to yet another embodiment of the invention the converter comprises members adapted to electrically connect one end of a row of power semiconductor devices to an end of an adjacent row of power semiconductor devices arranged on the opposite side of the column for series connection of said rows, and said members comprises said metal tubes being electrically connected to such ends of said rows for electrically connecting these ends to each other. This means that the bus bars arranged in converters already known for connecting said rows to each other may be omitted by arranging said metal tubes there further simplifying the structure by combining three functions into one and the same feature, the metal tubes.

According to another embodiment of the invention the converter comprises members adapted to electrically connect one end of a row of power semiconductor devices to an end of an adjacent row of power semiconductor devices arranged on the opposite side of the column for series connection of said rows, and said members comprises conductors electrically insulated with respect to said metal tubes and connecting to such ends of said rows for electrically connecting these ends to each other. Such separate conductors may be arranged in cases in which it is desired to choose a material for the metal tubes having a too high resistivity for making them suitable for interconnecting said rows of power semiconductor devices. Material costs may also be a parameter when choosing between this or the previous embodiment. Using tubes of metal as combined conductor and coolant path also opens the possibility to integrate the function of resistive damping element in the converter, if such a need should arise. In this case the conductor area of the tubes and the material resistivity is chosen to give a suitable total resistance.

According to another embodiment of the invention said rows of power semiconductor devices extend substantially horizontally along two opposite sides of the column while being stepwise from one such side to the other on a higher level, and said metal tubes extend over said connecting sides inclined with respect to the horizontal from one such level to the next level.

According to another embodiment of the invention said coolant liquid conducting tubes extend around said column from the bottom to the top thereof in one single loop following the current path through the converter valves. By allowing said tubes to pass along the current path in a serpentine around the converter it is possible to conveniently combine a number of functions of said tubes and by that obtain a simpler and less expensive structure. Another advantage of allowing the coolant liquid to follow the current path through the converter is that a distribution of the direct voltage between different power semiconductor devices is made more uniform, since disturbances caused by electrical current within the coolant liquid in said ascending and descending tubes are removed.

According to another embodiment of the invention said cooling means is adapted to feed water as coolant liquid in said tubes, and according to a further embodiment of the invention the metal tubes are made of aluminum or stainless steel, which are materials suited for conducting coolant liquid as well as shielding electric fields, and also conducting current when desired.

According to another embodiment of the invention the converter has two converter valves or four converter valves arranged on top of each other in said column, which are typical designs for converters of this type.

According to yet another embodiment of the invention the converter comprises a plurality of series connections of converter valves connected in parallel with each other and each series connection is arranged in at least one said column, and the converter may then for example have three said series connections of converter valves connected in parallel with each other for providing for three phases on an AC-side of the converter.

The invention also relates to a converter. This converter addresses a problem of an uneven distribution of direct voltage in different power semiconductor devices in known converters of this type by allowing the coolant liquid to follow the current path through the converter.

According to another embodiment of the invention the converter is adapted to convert voltages being on a DC-side of the converter above 50 kV, above 200 kV, above 400 kV or 600 kV-1000 kV. The invention is the more interesting the higher said voltage is, although it may also be favourable for voltages being low in this context, which means for instance in the order of 200 kV.

The invention also relates to a converter station for connecting an AC-system to an HVDC transmission line provided with at least one converter according to the invention, a converter station for connecting an AC-system to another AC-system in a back-to-back application provided with at least one converter according to the invention as well as an HVDC (High Voltage Direct Current) transmission system having converter stations with at least one converter according to the invention. The invention also relates to a high voltage AC transmission system having a converter station with at least one converter according to the invention, a use of a converter according to the invention in a converter station of an HVDC transmission system, as well as a use of a converter according to the invention in a back-to-back converter station of a high voltage AC transmission system, and the results of the arrangement of such a converter and use thereof with respect to making constructions simpler and less costly appear from the discussion above of converters according to different embodiments of the invention.

Further advantages as well as advantageous features of the invention will appear from the following description of embodiments of the invention.

BRIEF DESCRIPTION OF THE DRAWINGS

With reference to the appended drawings, below follows a specific description of converters according to embodiments of the present invention.

In the drawings:

FIG. 2 is a schematic view illustrating a converter valve column of a converter according to an embodiment of the invention from one side.

FIG. 3 is a view similar to FIG. 2 of the converter column according to FIG. 2 as seen in a direction perpendicular to the viewing direction of FIG. 2.

DETAILED DESCRIPTION OF EMBODIMENTS OF THE INVENTION

Figure 1:
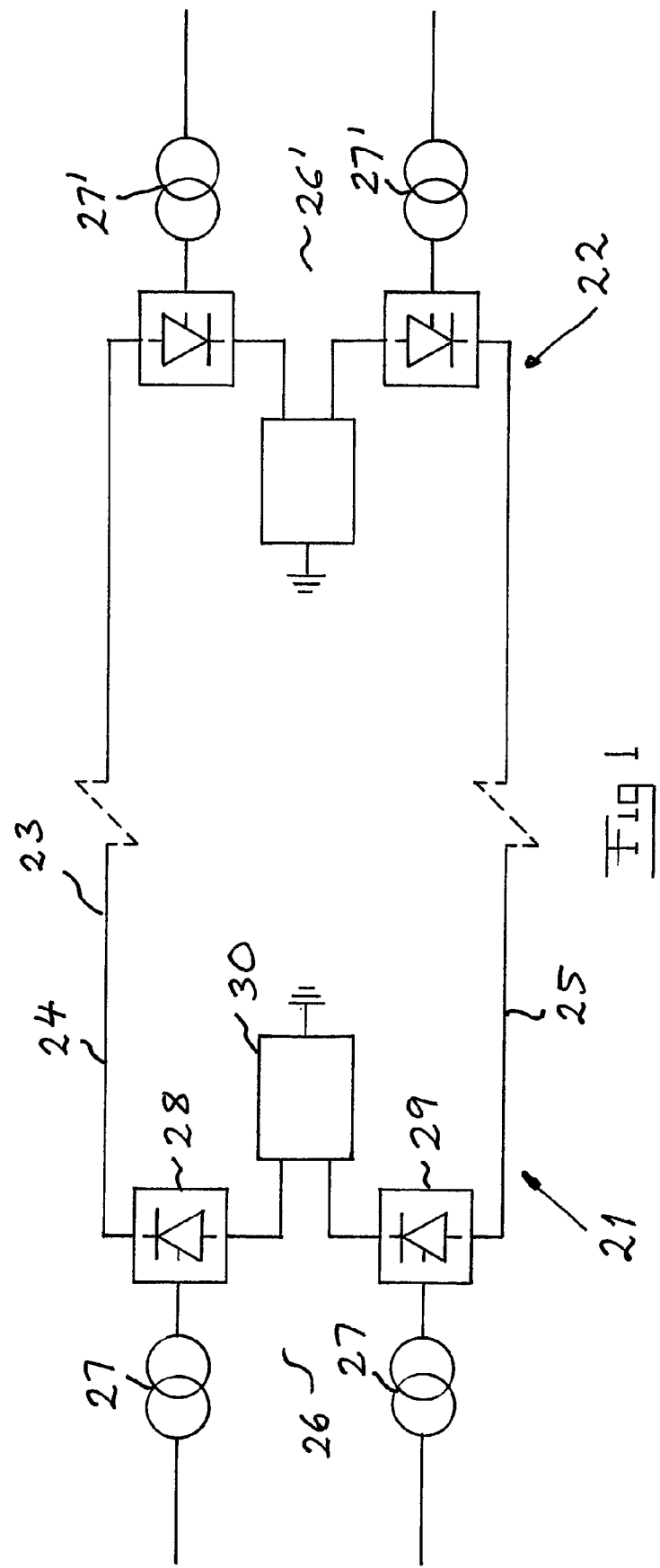
FIG. 1 is a schematic view of an HVDC transmission system, which may have converters according to the invention.

The general design of a HVDC transmission system which may have a converter according to the invention is schematically shown in FIG. 1. It is shown how a converter station 21, 22 is arranged at each end of a HVDC transmission line 23 having two poles 24, 25, one with positive and one with negative polarity. An AC system 26, 26' is connected to each converter station through transformers 27, 27' for obtaining a suitable level of the voltage of said DC system. The AC system may be a generating system in the form of any type of power plant with generators of electricity or a consuming system or network connecting to consumers of electric power, such as industries and communities. Each converter station has one or two converters 28, 29 each having a DC-side thereof connected on one hand to a respective of said poles 24, 25 and on the other to a DC neutral arrangement 30 in common to the converters and connecting the low voltage side thereof to earth for defining a certain voltage on each pole. Each converter 28, 29 may be replaced by a set of converters, such as two or three, connected in series for obtaining high voltages, may be in the order of 800 kV. The converters include a number of current valves in any known configuration, for instance in a 12-pulse bridge configuration. The converters may be line commutated Current Source Converters in which the switching elements, such as thyristors, are turned off at zero crossing of the AC current in said AC system. The converters may also be forced commutated Voltage Source Converters, in which said switching elements are turn-off devices controlled according to a Pulse Width Modulation (PWM) pattern.

FIG. 2 illustrates a so-called double valve of a converter according to the present invention which may be a converter in the system shown in FIG. 1. This double valve is a series connection of two converter valves 1, 2 having power semiconductor devices connected in series and arranged in superimposed layers within the converter valves. The two valves are arranged on top of each other in a column having a substantially rectangular cross-section. One end 3 of the column is adapted to be connected to high potential, whereas the other end 4 is adapted to be connected to low potential on a DC-side of the converter or converters. Surge arresters 5, 6 are connected in parallel with each converter valve for protecting the converter valve against over-voltages. An AC-system is intended to be connected to the midpoint 7 between the converter valves.

This converter column may together with two similar such converter columns form a converter having a so-called 6-pulse bridge configuration. However, it is also possible that this converter column alone includes all the converter valves of the converter then connected to a one-phase AC-system. All the features described so far are well known to those with skill in the art.

The new and characterizing features of the present invention will now be described while making reference to FIGS. 2-4. The converter has power semiconductor devices 8, such as thyristors, arranged in substantially horizontal rows 20 extending along opposite sides 9, 10, in fact the long sides, of the column while being stepwise from one such side to the other on a higher level. In the present case 18 such thyristors are connected in series in such a row, arranged nine and nine with a valve reactor (not shown) between such groups. All the thyristors belonging to the same converter valve are connected in series as will be described further below.

The converter also having means for cooling the power semiconductor devices dissipating a lot of heat energy in operation due to the high powers transmitted through a converter of this type, since the voltage across the two ends 3, 4 may well be in the order of 400 kV, and in embodiments having four converter valves on top of each other in the order of 600 kV-1000 kV, whereas currents of 500 A-5 kA are normal. This cooling means comprises cooling blocks 11 of for instance aluminum arranged in contact with each of the thyristors. These blocks are cooled by coolant liquid, such as water, passing through the cooling blocks in tubes 12 extending in a loop along the current path in the converter valves in a serpentine around the converter as appears from FIGS. 2 and 3. The coolant liquid from these tubes is circulated by a pump not shown while passing said cooling blocks for cooling the power semiconductor devices in contact therewith. By letting the coolant liquid, such as water, follow the current path an uneven distribution of voltage across the different thyristors is reduced to a minimum.

The tubes 13 are at the long sides of the column made of an electrically insulating material, such as plastic, whereas the tubes 14 on the short sides, where no connections to cooling blocks are made, are of metal, such as aluminum or stainless steel.

Means for shielding the column from electric field have to be arranged around the column outside the layers of power semiconductor devices, and this is on the long sides achieved by arranging electric field shielding screens 15 in the form of plates of for instance aluminum. These are arranged on the outside of the plastic tubes 13.

However, thanks to the arrangement of metal tubes 14 on the short sides of the column interconnecting the plastic tubes running along adjacent rows of power semiconductor devices on opposite sides of the column no electric field shielding screens are necessary on the short sides, since the metal tubes are arranged above each other, here three such tubes, so as to form an electric field shielding screen. This results in a substantial saving of costs for such screens.

Figure 4:
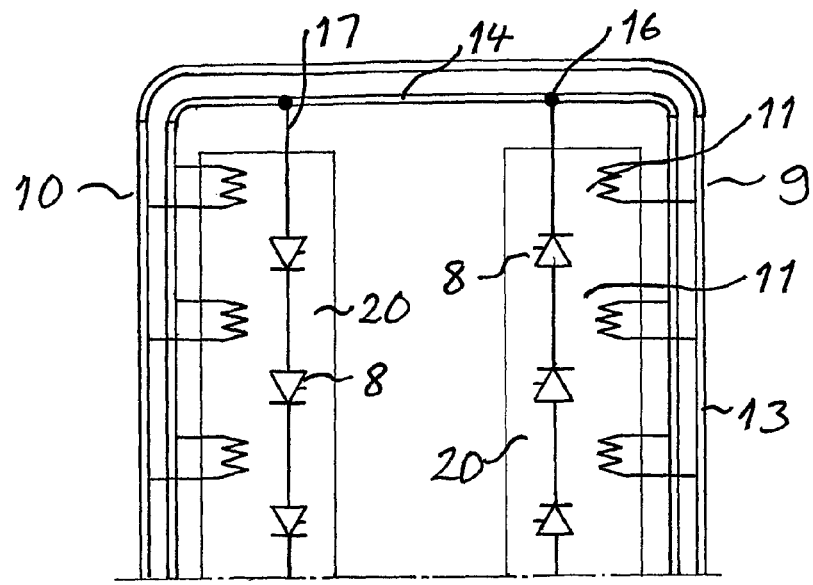
FIG. 4 is a very schematic view illustrating how the power semiconductor devices and cooling blocks are arranged in a layer in a converter valve of the converter column shown in FIG. 2.

Furthermore, in the embodiment shown in FIG. 4 these metal tubes are also used to electrically connect one end 16 of a row 20 of power semiconductor devices to an end 17 of an adjacent row of power semiconductor devices arranged on the opposite side of the column, which means that no connecting busbars used for this task in converters of the prior art are needed simplifying the structure of the converter further.

Figure 5:
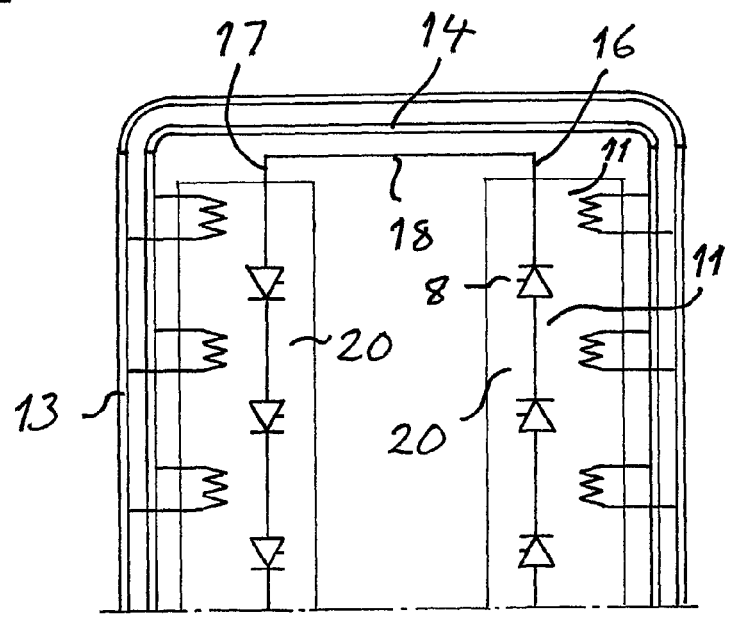
FIG. 5 is a view similar to FIG. 4 for a converter according to another embodiment of the invention.

FIG. 5 illustrates a part of a converter according to another embodiment of the invention, which differs from the one shown in FIG. 4 by the fact that a conductor 18, such as a busbar, is arranged to connect said ends 16, 17 of the rows of power semiconductor devices to each other, so that the metal tubes 14 will in this embodiment conduct coolant liquid and form an electric field shielding screen, but not conducting any current. This may be suitable when there are good reasons for choosing a metal for the metal tubes not having a resistivity being as low as desired for connecting the current between the rows. Other considerations, such as material costs, may also influence the choice of embodiment, that according to FIG. 4 or that according to FIG. 5.

The invention is of course not in any way restricted to the embodiments described above, but many possibilities to modifications thereof will be apparent to a person with ordinary skill in the art without departing from the basic idea of the invention as defined in the appended claims.

It is pointed out that "rectangular" also covers "square" with respect to the cross-section of the column.

Furthermore, it is within the scope of the invention to have metal tubes extending over only one part, such as one short side, or over more than two parts of the circumference of the converter column. The power semiconductor devices may also be arranged otherwise than described above, such as according to a U in one layer with a connection of each leg to an opposite leg of such a U in adjacent layers thereabove and therebelow, respectively.

The invention claimed is:

1. A converter for converting alternating voltage into direct voltage and vice versa in a converter station of a high voltage transmission system, said converter comprising:
   a series connection of converter valves having power semiconductor devices connected in series and arranged in superimposed layers, said valves forming at least one column of one or more converter valves,
   a cooling module configured to cool the power semiconductor devices, the cooling module comprising coolant blocks in contact with each of said power semiconductor devices and tubes extending around the column while conducting a coolant liquid in at least one loop through said blocks, and
   a shield configured to shield an environment of said column from an electric field arranged around the column outside said layers of power semiconductor devices,
   wherein said power semiconductor devices are in each said layer arranged in at least one row with a coolant block in contact with each power semiconductor device,
   wherein said coolant liquid conducting tubes arranged in an extension over at least one part of a circumference of said column having no connections to said coolant blocks made of metal, wherein at least one such metal tube is arranged in said part for over this part of the column circumference also forming an electric field shielding screen, wherein said coolant liquid conducting tubes are when extending over parts of said circumference of the column where connections are made to the coolant blocks made of an electrically insulating material, and wherein an electric field is shield arranged outside the column over these parts.

2. The converter according to claim 1, wherein said electric field shield comprises electric field shielding screens.

3. The converter according to claim 1, wherein said electric field shield is at least partly formed by having water flowing in said tubes of an electrically insulating material.

4. The converter according to claim 1, wherein said electric field shield comprises said tubes of an electrically insulating material comprising dopants for making the electric field shield somewhat semiconducting.

5. The converter according to claim 1, wherein said electric field shield comprises an arrangement of lengths of conducting material interposed between lengths of electrically insulating material in said tubes of an electrically insulating material.

6. The converter according to claim 1, wherein a plurality of metal tubes are arranged above each other in said part of the column circumference for forming said electric field shielding screen.

7. The converter according to claim 1, wherein said column has a substantially rectangular cross-section, wherein said power semiconductor devices are arranged in substantially horizontal rows extending along opposite sides of said column, and wherein said coolant liquid conducting tubes are formed by one or more metal tubes in the extension over the two other sides of the column connecting said opposite sides.

8. The converter according to claim 7, wherein said rows extend along the long sides of the column and said metal tubes along the short sides thereof.

9. The converter according to claim 7, further comprising:
   members adapted to electrically connect one end of a row of power semiconductor devices to an end of an adjacent row of power semiconductor devices arranged on the opposite side of the column for series connection of said rows, wherein said members comprise said metal tubes being electrically connected to the ends of said rows for electrically connecting the ends to each other.

10. The converter according to claim 7, further comprising:
    members adapted to electrically connect one end of a row of power semiconductor devices to an end of an adjacent row of power semiconductor devices arranged on the opposite side of the column for series connection of said rows, wherein said members comprise conductors electrically insulated with respect to said metal tubes and connecting to ends of said rows for electrically connecting these ends to each other.

11. The converter according to claim 7, wherein said rows of power semiconductor devices extend substantially horizontally along two opposite sides of the column while being stepwise from one such side to the other on a higher level, and wherein said metal tubes extend over said connecting sides inclined with respect to the horizontal from one such level to the next level.

12. The converter according to claim 1, wherein said coolant liquid conducting tubes extend around said column from the bottom to the top thereof in one single loop following the current path through the converter valves.

13. The converter according to claim 1, wherein said cooling means is adapted to feed water as coolant liquid in said tubes.

14. The converter according to claim 1, wherein said metal tubes comprise aluminum or stainless steel.

15. The converter according to it has claim 1, wherein the converter comprises two converter valves or four converter valves arranged on top of each other in said column.

16. The converter according to claim 1, further comprising:
    a plurality of series connections of converter valves connected in parallel with each other and each series connection is arranged in at least one said column.

17. The converter according to claim 16, wherein the converter comprises three said series connections of converter valves connected in parallel with each other for providing for three phases on AC-side of the converter.

18. A converter for converting alternating voltage into direct voltage and vice versa in a converter station of a high voltage transmission system, said converter comprising:
    a series connection of converter valves having power semiconductor devices connected in series and arranged in superimposed layers, said valves forming at least one column of one or more converter valves, and
    a cooling module configured to cool the power semiconductor devices including cooling blocks in contact with each of said devices and tubes extending around the column while conducting a coolant liquid in at least one loop through said blocks,
    wherein said power semiconductor devices are in each said layer arranged in at least one row with a coolant block in contact with each power semiconductor device, and wherein said coolant liquid conducting tubes extend around said column from the bottom to the top thereof in one single loop following the current path through the converter valves.

19. The converter according to claim 18, wherein the converter is adapted to convert voltages being on a DC-side of the converter above 50 kV.

20. The converter according to claim 1, wherein the converter connects an AC-system to an HVDC transmission line.

21. The converter according to claim 1, wherein the converter connects an AC-system to another AC-system in a back-to-back application.

22. The converter according to claim 1, wherein the converter is included in a high voltage direct current transmission system.

23. The converter according to claim 1, wherein the converter is included in a high voltage AC transmission system in a back-to-back application.

* * * * *

UNITED STATES PATENT AND TRADEMARK OFFICE
CERTIFICATE OF CORRECTION

| | | |
|---|---|---|
| PATENT NO. | : 8,437,113 B2 | Page 1 of 1 |
| APPLICATION NO. | : 12/306022 | |
| DATED | : May 7, 2013 | |
| INVENTOR(S) | : Jacobson et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1169 days.

Signed and Sealed this
Fourth Day of November, 2014

Michelle K. Lee
*Deputy Director of the United States Patent and Trademark Office*